United States Patent [19]

Tanabe

[11] Patent Number: 5,559,583

[45] Date of Patent: Sep. 24, 1996

[54] EXPOSURE SYSTEM AND ILLUMINATING APPARATUS USED THEREIN AND METHOD FOR EXPOSING A RESIST FILM ON A WAFER

[75] Inventor: Hiroyoshi Tanabe, Tokyo, Japan

[73] Assignee: NEC Corporation, Tokyo, Japan

[21] Appl. No.: 394,942

[22] Filed: Feb. 24, 1995

[30] Foreign Application Priority Data

Feb. 24, 1994 [JP] Japan ..................................... 6-025828
May 13, 1994 [JP] Japan ..................................... 6-099816

[51] Int. Cl.$^6$ .......................... G03B 27/42; G03B 27/72; G03B 27/32
[52] U.S. Cl. .................................. 355/71; 355/53; 355/77
[58] Field of Search .................................. 355/71, 53, 375

[56] References Cited

U.S. PATENT DOCUMENTS

| | | | |
|---|---|---|---|
| 4,519,694 | 6/1983 | Kashiwagi et al. | 355/5 |
| 5,285,258 | 2/1994 | Kamon | 356/375 |
| 5,300,972 | 4/1994 | Kamon | 355/71 |
| 5,311,249 | 5/1994 | Kamon et al. | 355/71 |
| 5,329,333 | 7/1994 | Noguchi et al. | 355/53 |
| 5,442,184 | 8/1995 | Palmer et al. | 250/442.2 |
| 5,467,166 | 11/1995 | Shiraishi | 355/71 |

FOREIGN PATENT DOCUMENTS 1-143216 6/1989 Japan .
3-78225 4/1991 Japan .

OTHER PUBLICATIONS

D. Fehrs, "Illuminator Modification of an Optical Aligner", KTI Microelectronics Seminar, Nov. 6–7, 1989, pp. 217–230.

E. Shalom et al., "Sidewall profile control through processing and dye additives", Advances in Resist Technology and Processing VII, 1990, pp. 188–205.

D. Dunn et al., "DUV Photolithography Linewidth Variation From Reflective Substrates", Optical/Laser Microlithography IV, 1991, pp. 8–15.

Primary Examiner—Arthur T. Grimley
Assistant Examiner—Herbert Kerner
Attorney, Agent, or Firm—Young & Thompson

[57] ABSTRACT

An exposure system includes at least an illuminating system for irradiating a linearly polarized illumination light on a mask with a predetermined pattern and a mounting system on which a wafer is placed, the wafer is provided thereon with a resist film, wherein further provision is made of an element for controlling a polarization direction of the light at a p-polarization direction at least when the light is irradiated on a sloped or vertical portion of the wafer.

13 Claims, 9 Drawing Sheets

EXPOSURE SYSTEM AND ILLUMINATING APPARATUS USED THEREIN AND METHOD FOR EXPOSING A RESIST FILM ON A WAFER

BACKGROUND OF THE INVENTION

The invention relates to an exposure system for exposing a resist film on a semiconductor wafer, and further relates to an illuminating apparatus used in the exposure system for illuminating a mask having a circuit pattern to expose the resist film. The invention also relates to a method of the exposure.

Exposure process is one of the most very important processes for fabricating semiconductor integrated circuits. To achieve a scaling down of the semiconductor integrated circuits, it is essential that a precise and exact projection of a fine mask pattern to a resist film on a wafer is accomplished by use of an excellent exposure system.

A degree of the flatness of a surface of a wafer on which resist film is provided had substantially provided a limit to the critical dimensions in photo-lithography. The exposure is accomplished for projection of a mask pattern to a resist film having a photo-sensitivity provided on wafer wherein the mask is placed between an illumination source and the resist film. The mask comprises a transparent plate and opaque portions provided on a surface of the plate. Light for illumination passes through the mask except for the opaque portions.

Generally, the illumination light which has passed through the mask with the circuit pattern are irradiated at a right angle on a surface of the wafer on which the resist film with a photo-sensitivity was provided. The illumination light is irradiated on the resist film and passes it to arrive at the surface of the wafer where a part of the illumination light is then reflected. A reflective direction of the illumination light from the surface of the wafer depends upon an orientation of the surface of the wafer. Even ideal wafer has a completely flat surface, actual wafer necessarily has a somewhat irregular surface as including a sloped area or a dropped portion due to complicated multilayer structures involving wiring layers and any elements. When the illumination light is spotted on the sloped area, then a reflected portion of the light in the resist film on the wafer has an oblique direction. For that reason, the illumination light including a portion thereof once reflected from the sloped area has already lost the information of the mask pattern. The oblique reflection of the light by the oblique surface allows the reflected light portion to come into a position in the resist film however right under the opaque portion of the mask, even in the right under portion of the resist film no illumination light should exist. Namely, the a portion of the resist film, which should be kept from the exposure, is forced to be exposed to the illumination light. Further, even if the surface of the wafer has a good flatness, a large reflectivity of the illumination light may allow a standing wave to exist in the resist film thereby resulting in a serious problem with decline of the resist profile.

To combat the above problem, it was proposed to provide an anti-reflecting coat between the resist film and the surface of the wafer for suppression of the reflection of the light. This way is, however, engaged with the another serious problem in providing contamination to the wafer. In view of the fabrication processes, that way has a disadvantage in need for further fabrication steps.

Alternatively, proposed another way is to use a resist containing dye additives to reduce an amount of the illumination light capable of arriving on the surface of the wafer. Notwithstanding, this way is faced directly to other problem in decline of a vertical resist profile after exposure.

SUMMARY OF THE INVENTION

Accordingly, it is a primary object of the present invention to provide a novel exposure system free from any problems as described above.

It is a further object of the present invention to provide a novel exposure system allowing a precise and complete projection of informations about a fine mask pattern onto a resist film provided on a wafer.

It is a furthermore object of the present invention to provide a novel exposure system allowing a considerable reduction of a reflected amount of an illumination light from a surface of a wafer.

It is a moreover object of the present invention to provide a novel exposure system allowing use of a resist film free from any dye additives.

It is a still further object of the present invention to provide a novel exposure system free from any deed to use an anti-reflective coating.

It is an another object of the present invention to provide a novel illuminating apparatus to be used in an exposure system free from any problems as described above.

It is still another object of the present invention to provide a novel illuminating apparatus to be used in an exposure system allowing a precise and complete projection of informations about a fine mask pattern onto a resist film provided on a wafer.

It is yet another object of the present invention to provide a novel illuminating apparatus to be used in an exposure system allowing a considerable reduction of a reflected amount of an illumination light from a surface of a wafer.

It is further another object of the present invention to provide a novel illuminating apparatus to be used in an exposure system allowing use of a resist film free from any dye additives.

It is moreover another object of the present invention to provide a novel illuminating apparatus to be used in an exposure system free from any deed to use an anti-reflective coating.

It is an additional object of the present invention to provide a novel exposure method free from any problems as described above.

It is a further additional object of the present invention to provide a novel exposure method allowing a precise and complete projection of informations about a fine mask pattern onto a resist film provided on a wafer.

It is a furthermore additional object of the present invention to provide a novel exposure method allowing a considerable reduction of a reflected amount of an illumination light from a surface of a wafer.

It is a moreover additional object of the present invention to provide a novel exposure method allowing use of a resist film free from any dye additives.

It is yet an additional object of the present invention to provide a novel exposure method free from any deed to use an anti-reflective coating.

It is a still additional object of the present invention to provide a novel exposure method to be accomplished by a small number of processes.

The above and other objects, features and advantages of the present invention will be apparent from the following descriptions.

The invention provides an exposure system including at least an illuminating system for irradiating a linearly polarized illumination light on a mask with a predetermined pattern and a mounting system on which a wafer is placed, the wafer is provided thereon with a resist film, wherein further provision is made of an element for controlling a polarization direction of the light at a p-polarization direction at least when the light is irradiated on a sloped or vertical portion of the wafer. The mounting system comprises a rotatable mounting plate on which the wafer is placed and a rotation controller for controlling a rotation of the mounting plate so that the polarization direction of the light is kept at a p-polarization direction at least when the light is irradiated on a sloped or vertical portion of the wafer. The control element comprises a polarizer being provided between a light source and optical lenses. The control element comprises a half wave plate. The controlling element is provided between a light source and optical lenses and having an oblique incident feature which allows the light to be irradiated on the mask at an oblique angle to a surface of the mask. The control element comprises a space filter having at least a plurality of half wave plates being spaced apart from each other, each of the half wave plates having a polarization direction along with a radial direction of the filter. The space filter has a disk-like shape and the half wave plates are provided in the form of circulation along with a peripheral portion of the space filter for annular illumination where polarization directions of the individual half wave plates are directed toward radial directions. The space filter has a disk-like shape and the half wave plates are provided in contact with each other and continuously from a center of the space filter to the peripheral portion where polarization directions of the individual half wave plates are directed toward radial directions. The control element comprises a polarizer and a scanning system being provided between the polarizer and optical lenses for conducting a scanning of the illumination light over the mask, the scanning system having an oblique incident feature which allows the light to be irradiated on the mask at an oblique angle to a surface of the mask. The scanning system comprises a pair of reflecting mirrors provided with controllers for controlling mirror face directions in association with an operation of the polarizer to implement the scanning of the light so that the light is irradiated on the mask at an oblique angle during the scanning.

The invention also provides an illuminating system involved in an exposure system for irradiating a linearly polarized illumination light on a mask with a predetermined pattern, wherein provision is made of an element for controlling a polarization direction of the light at a predetermined direction. The polarization direction is controlled at a p-polarization direction. The control element comprises a polarizer being provided between a light source and optical lenses. The control element comprises a half wave plate. The controlling element is provided between a light source and optical lenses and having an oblique incident feature which allows the light to be irradiated on the mask at an oblique angle to a surface of the mask. The control element comprises a space filter having at least a plurality of half wave plates being spaced apart from each other, each of the half wave plates having a polarization direction along with a radial direction of the filter. The space filter has a disk-like shape and the half wave plates are provided in the form of circulation along with a peripheral portion of the space filter for annular illumination where polarization directions of the individual half wave plates are directed toward radial directions. The space filter has a disk-like shape and the half wave plates are provided in contact with each other and continuously from a center of the space filter to the peripheral portion where polarization directions of the individual half wave plates are directed toward radial directions. The control element comprises a polarizer and a scanning system being provided between the polarizer and optical lenses for conducting a scanning of the illumination light over the mask, the scanning system having an oblique incident feature which allows the light to be irradiated on the mask at an oblique angle to a surface of the mask. The scanning system comprises a pair of reflecting mirrors provided with controllers for controlling mirror face directions in association with an operation of the polarizer to implement the scanning of the light so that the light is irradiated on the mask at an oblique angle during the scanning.

The invention also provides an exposure method by irradiating an illumination light through a mask having a predetermined pattern onto a resist film on a wafer for projecting optical image of mask patterns on the resist film, wherein a polarization direction of the light is controlled at a p-polarization direction at least when the light is irradiated on a sloped or vertical portion of the wafer.

BRIEF DESCRIPTIONS OF THE DRAWINGS

Preferred embodiments of the present invention will hereinafter fully be described in detail with reference to the accompanying drawings.

DESCRIPTIONS OF THE INVENTION

According to the present invention, a novel exposure system may comprise an illuminating system provided over a mask having a predetermined pattern for irradiating an illumination light onto the mask and a projecting system provided under the mask and over a resist film having a photo-sensitivity on a wafer for projecting optical images of the mask pattern onto the resist film wherein the exposure system is further provided with a control system for controlling a polarization direction of the illumination light to be irradiated onto the resist film on the wafer. The controller is able to so control the polarization direction of the illumination light as to permit a p-polarized light to be irradiated on a sloped area of the surface of the wafer. The p-polarized light means a linearly polarized light wherein a vibration direction of an electric vector of the incident light is included in an incident plane. By contrast, an s-polarized light also means a linearly polarized light wherein a vibration direction of an electric vector of the incident light is vertical to the incident plane. Consequently, the exposure system of the present invention is provided with the control system for controlling the polarization direction of the illumination light to keep a p-polarization against a sloped area in the surface of the wafer. The control of the polarization direction of the illumination light to keep the p-polarization against of the sloped area of the surface of the wafer may be accomplished by either direct control of the polarization direction of the incidental light or control of a direction of the wafer. For controlling the direction of the wafer, it may be possible to rotate a stage on which the wafer is placed to allow the incident light to have the p-polarization against a sloped area of the surface of the wafer.

The p-polarized light incidence onto the sloped area of the surface of the wafer may permit the exposure system to conduct a precise and complete projection of the optical image of the mask pattern onto the resist film on the wafer, the reason of which will hereinafter be described in detail.

Figure 1:
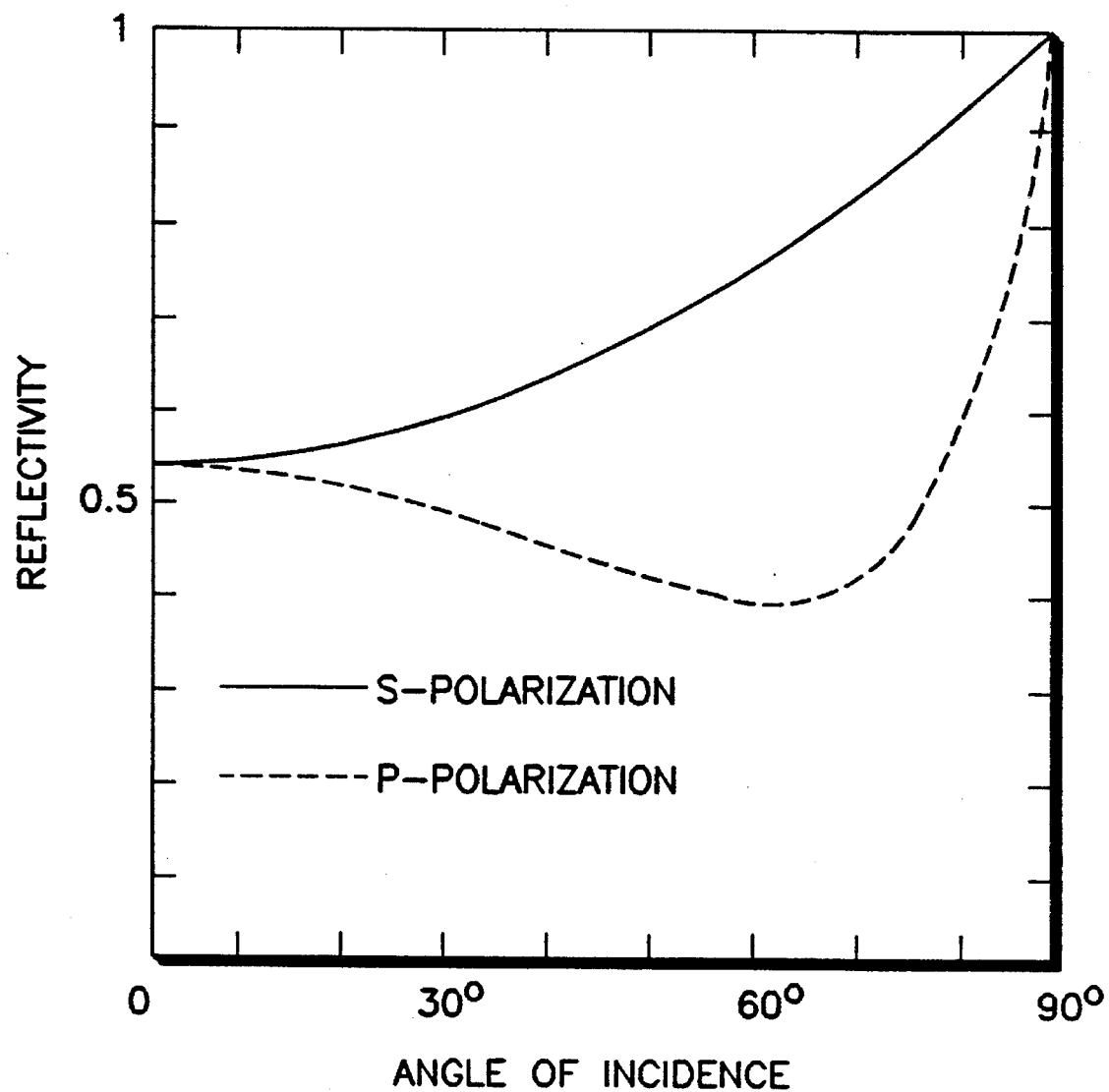
FIG. 1 is a diagram illustrative of a reflectivity of each of p-polarized and s-polarized lights versus various angles of incidence of light onto an interface.

As described above, the decline of the mask pattern projected on the wafer is caused by the reflection in the oblique direction of the illumination light from the sloped area in the surface of the wafer. To obtain the allowability of the desired precise and complete projection of the fine mask pattern onto the resist film with the photo-sensitivity on the wafer, it is essential to obtain a possible suppression of the oblique reflection of the light from the sloped area of the surface of the wafer. The incidence of the illumination light on the sloped surface of the wafer may be regarded as an oblique incidence of the light on a plane. Each of the p-polarized and s-polarized lights have reflectivities versus various angle of incidence of the light as illustrated in FIG. 1 which shows a calculated reflectivity versus various angles of incidences of light wherein the calculation was made under the conditions that the resist film has a refractive index of n=1.76 and an absorption oefficient of k=0.012 and the silicon substrate or silicon wafer has a refractive index of n=1.41 and an absorption oefficient of k=3.35 and further an illumination light is a KrF Excimer laser beam having a wavelength of 248 nanometers. From FIG. 1, it could be appreciated that the p-polarized light shows a low reflectivity over non-zero various incident angles, while the s-polarized light shows a high reflectivity over non-zero various incident angles. For the p-polarized light, the reflectivity is reduced as the incident angle is increased from zero until about 60 degrees and has a minimum value at the incident angle of about 60 degrees. By contrast, the s-polarized light is simply increased by increasing of the incident angle and has a minimum value at zero incident angle. The p-polarized light has a smaller reflectivity over non-zero various angle of incidence of the light rather than the s-polarized light.

In the s-polarization, the direction of the electric field of the s-polarized light corresponds to the direction of induced current which may be caused on an interface of the wafer to the resist film thereby allowing the irradiation of the s-polarized light on the interface to cause a large amount of the induced current, resulting in a large degree of the reflection of the light from the interface. In the p-polarization, the direction of the electric field of the p-polarized light does not correspond to the direction of induced current thereby preventing the irradiation of the s-polarized light on the interface to cause the induced current, resulting in a small degree of the reflection of the light from the interface.

Figure 2:
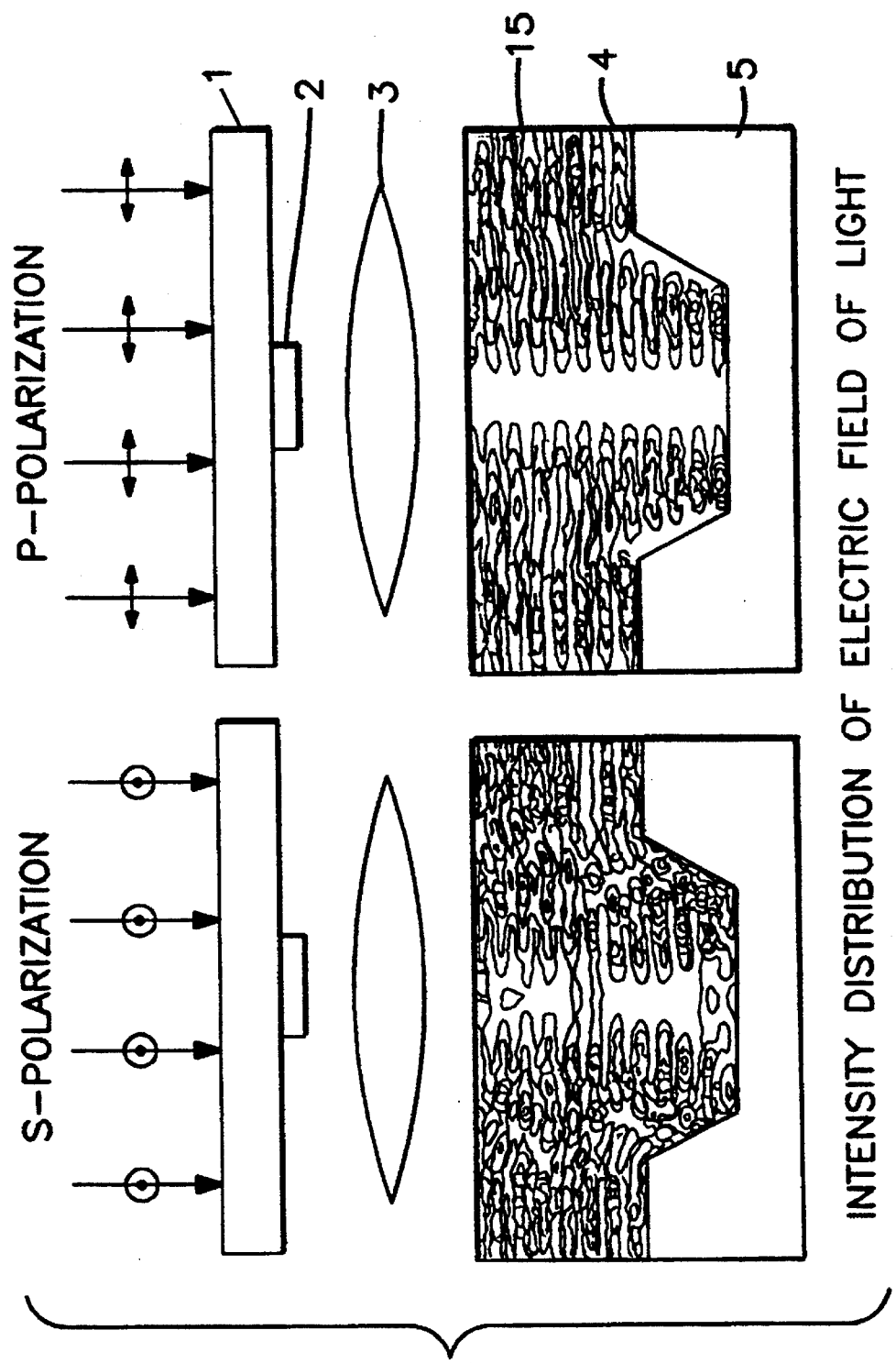
FIG. 2 is a comparative vertical view illustrative of intensity distributions of electric field of each of p-polarized and s-polarized lights in a resist film on a wafer.

The above result of the relationship of reflectivity versus incident angle means the facts that at non-zero incident angle or oblique incidence of light the p-polarized light shows a low reflectivity to allow a reduction of the oblique reflection of the light from the sloped area of the wafer surface while the s-polarized light shows a high reflectivity, resulting in an considerable amount of the oblique reflection of the light from the sloped area of the wafer surface. Those will be more apparent by referring to FIG. 2. The mask with a predetermined pattern comprises a glass substrate 1 and an opaque portion 2 provided on a bottom surface of the substrate 1. A optical lens 3 is placed under the mask but over a resist film 4 provided on a top surface of a substrate or wafer 5 which has a recessed portion defined by sloped side walls and a flat bottom. Two types of the linearly polarized lights or p-polarized and s-polarized lights are projected on the resist film 4 along with possessing the optical image of the mask pattern. The resist films on which the p-polarized and s-polarized lights were irradiated have different distributions 15 of electric field intensities of the lights. The resist film is sensitive to only the electric field of light but not magnetic field thereof. For the p-polarized light, right under the opaque portion no electric field of the light is present because almost no p-polarized light is reflected by the sloped wide walls of the recessed portion of the substrate surface. This means the fact that the optical image of the mask pattern is precisely and completely projected on the resist film 4. By contrast, for the s-polarized light, right under the opaque portion an appreciable amount of the electric field of the light is present because an appreciable amount of the s-polarized light is reflected by the sloped wide walls of the recessed portion of the substrate surface. This means a decline of the optical image of the mask pattern projected on the resist film 4. For the above reasons, the present invention utilizes the p-polarized light only for obtaining the precise and complete projection of the optical image of the mask pattern.

Needless to say, a part of the illumination light irradiated on the plane surface or the bottom plane at the right angle may be reflected thereby at the right angle, resulting in no oblique reflection of the light irradiated at the right angle thereby providing no decline of the optical image of the mask pattern projected on the resist film.

The exposure system according to the present invention may have illuminating system irradiating a linearly polarized illumination light on a mask with a predetermined pattern at an oblique angle to a surface of the mask wherein the linearly polarized light is preferably the p-polarized light. This illuminating system irradiating the linearly polarized light, preferably the p-polarized light onto the mask surface having a predetermined fine pattern is more useful when the mask pattern is extremely fine. As the mask patten is fine, then a diffraction angle of the illumination light in passing through the mask is large. If the illumination light is irradiated on a mask with an extremely fine pattern at the right angle to the surface of the mask, then only a zeroth order portion of the light is irradiated on a wafer, resulting in no optical image being projected on the surface of the wafer. By contrast, if the illumination light is irradiated on the extremely fine mask pattern at an oblique angle to the surface of the mask, then not only a zeroth order portion of the light but also at least any one of positive and negative first order portions thereof are irradiated on a wafer thereby allowing a certain optical image to be projected on the surface of the wafer.

Figure 3A:
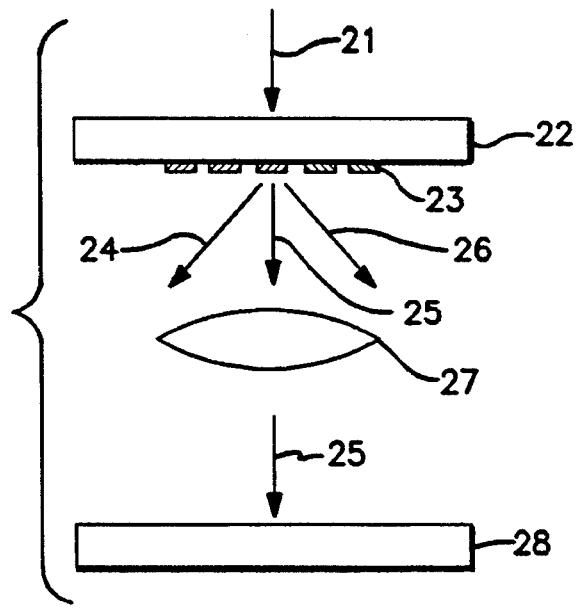
FIGS. 3A and 3B are vertical views illustrative of diffractions by a mask of each of vertical or oblique incident lights.

In FIG. 3A, a vertical-to-surface illumination light 21 is irradiated on a top surface of the mask comprising a transparent substrate 22 and opaque portions 23 defining fine mask patterns where the illumination light 21 is diffracted into a zeroth order part 25 and negative and positive first order parts 24 and 26. The zeroth order part 25 only passes through a lens 27 and irradiated on a wafer 28 so that the negative and positive order parts 24 and 26 are not irradiated on a surface of the wafer 28, resulting in no optical image being formed on the wafer 28 when the illumination light 21 shows the vertical incidence.

Figure 3B:
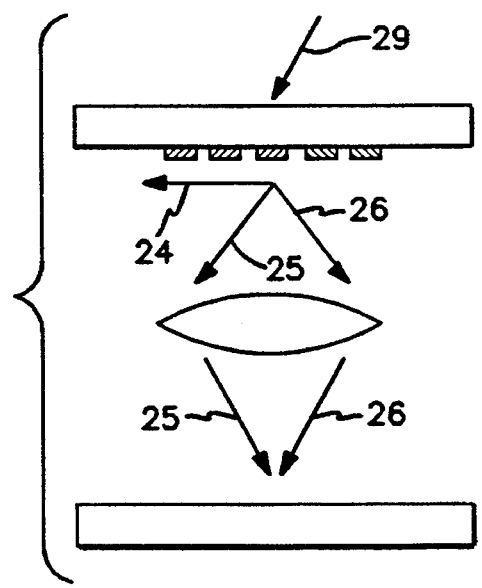

In FIG. 3B, an oblique illumination light 29 is irradiated on the mask and then diffracted into the zeroth order part 25 and the negative and positive first order parts 24 and 26, however not only the zeroth order part 25 but also the positive first order part 26 pass through the lens 27 and then irradiated on the wafer 28 so that the negative first order part 24 is not irradiated on the surface of the wafer 28, resulting in a certain optical image being formed on the wafer 28 when the illumination light 21 shows the oblique incidence.

Figure 4A:
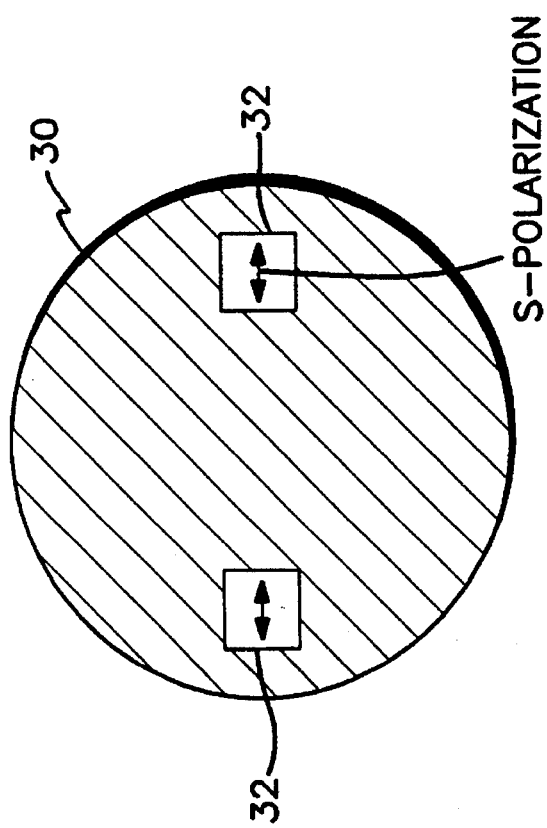
FIGS. 4A and 4B are plane views illustrative of space filters for p-polarization and s-polarization respectively.
Figure 4B:
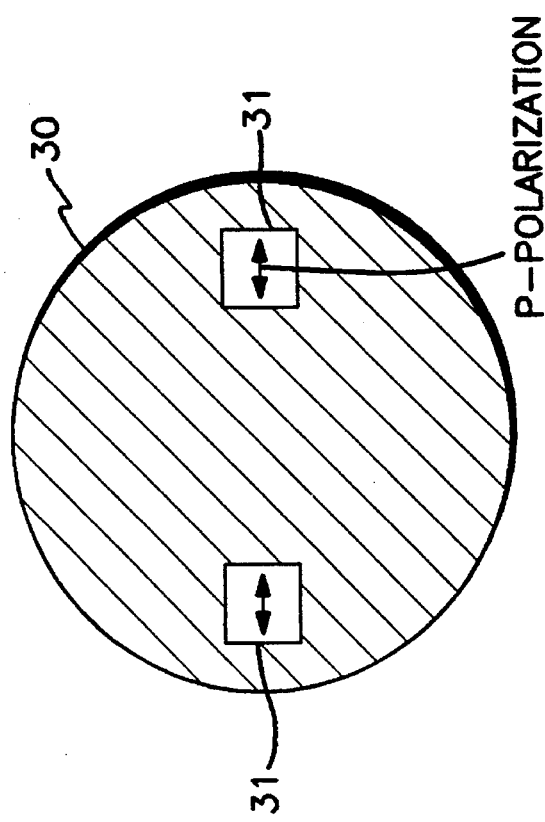

In view of the above, the illuminating system according to the present invention is designed to allow the illumination light to be irradiated on the mask at an oblique direction to the surface of the mask for obtaining a certain optical image projected on the wafer, although the mask pattern is extremely fine and the diffraction of the light in passing through the mask is large. The oblique incidence of the illumination light onto the mask may be obtained by a secondary illumination source as illustrated in FIGS. 4A and 4B. The secondary illumination light source 30 is covered by a space filter having two square apertures 31 and 32 both of which are spaced apart from each other and provided to be apart from a center portion of the secondary illumination light source 30 so that coherent factor sigma is from 0.5 to 0.6. A difference between FIGS. 4A and 4B is in the polarization direction. Namely, in FIG. 4A, the p-polarized light is illuminated through the two apertures 31, while in FIG. 4B, the s-polarized light is illuminated through the apertures 32. The two apertures spaced apart from each other provides oblique incidences of the linearly polarized lights on the mask.

Figure 5:
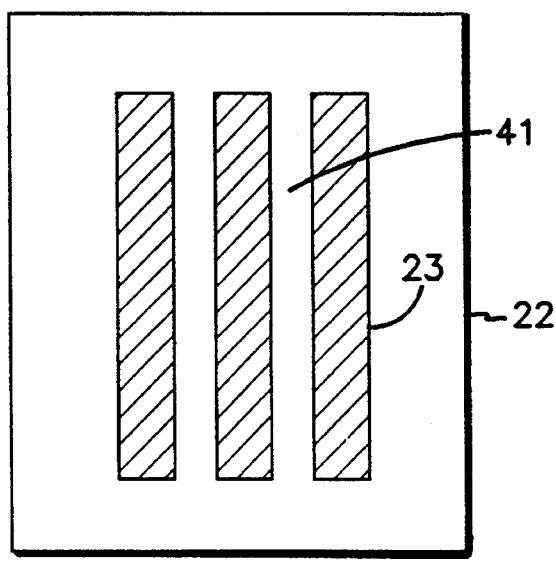
FIG. 5 is a plane view illustrative of a mask with a plurality of stripe pattern.
Figure 6:
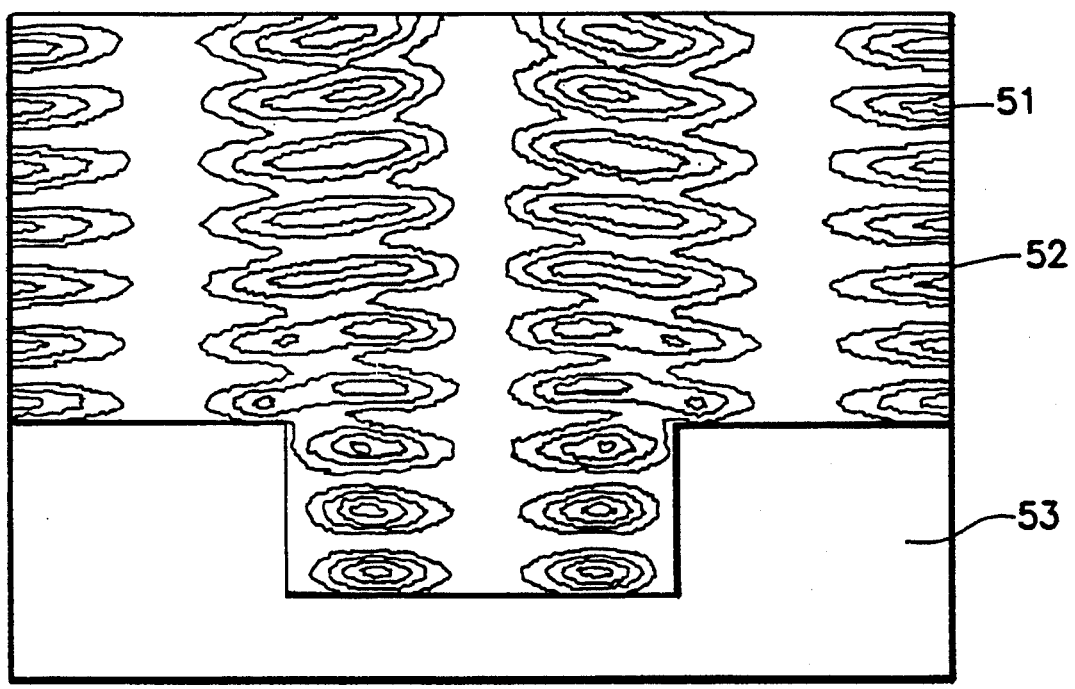
FIGS. 6 and 7 are vertical views illustrative of intensity distributions of electric field of each of p-polarized and s-polarized lights respectively in a resist film on a wafer.
Figure 7:
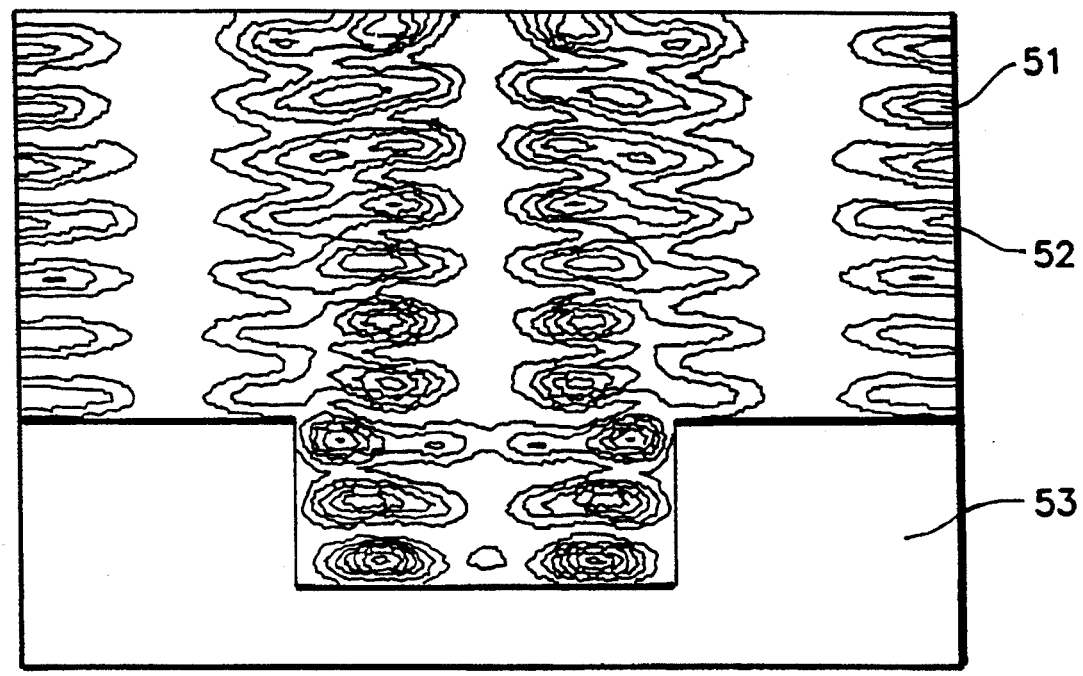

The linearly polarized illumination lights passed through the two apertures spaced apart from each other are irradiated on a mask 22 as illustrated in FIG. 5 and comprising a transparent substrate 41 and opaque portions 23 on the substrate 41. The mask has such a pattern that a width of each dark stripe line on the wafer and a pitch of the dark stripe lines are 0.2 micrometers. The illumination light is KrF Excimer laser with a wavelength of 248 nanometers. The projection optical system has a numerical aperture of 0.6. The illumination light having optical images of the mask pattern are then irradiated on a resist film provided on a wafer having a recessed portion defined by almost vertical side walls and a flat bottom. When the illumination light is the p-polarized light, then an intensity distribution of the electric field of the light in the resist film on the wafer with the recessed surface is as illustrated in FIG. 6. By contrast, when the illumination light is the p-polarized light, then the intensity distribution of the electric field of the light is as illustrated in FIG. 7. In FIG. 6, the intensity distribution 51 of the electric field of the light is near to the desired pattern. Namely, right under the opaque portions 23 of the mask 22 illustrated in FIG. 5 no electric filed of the light exist. This means the fact that the optical image of the mask pattern is precisely and exactly projected by the p-polarized light on the resist film 52 although the wafer surface has the vertical walls of the recessed portion. In FIG. 7, the intensity distribution 51 of the electric field of the light is far from the desired pattern. Namely, right under the opaque portions 23 of the mask 22 illustrated in FIG. 5, an appreciable amount of the electric filed of the light exist due to the reflection of the light from the vertical walls of the recessed portion of the wafer 53. This means the fact of a serious decline of the mask pattern optical image projected by the s-polarized light on the resist film 52.

In view of the above, the linearly polarized illumination light is preferably the p-polarized light for enabling the precise and exact optical image of the fine mask pattern to be projected on the resist film. The p-polarized light is irradiated on the mask at the oblique angle to the surface of the mask for securing a certain, precise and exact optical mask pattern projected on the resist film on the wafer even the wafer has a recessed portion or a poor surface flatness.

Figure 8:
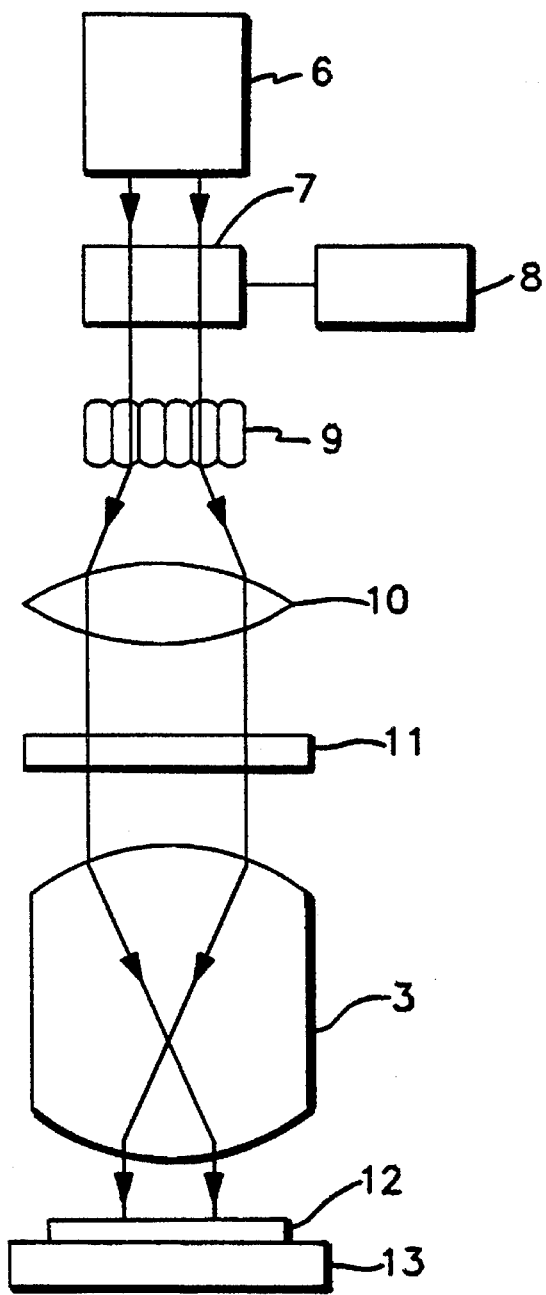
FIGS. 8 and 9 are diagrams illustrative of exposure systems in first and second embodiments according to the present invention respectively.

A first embodiment according to the present invention will be described in which a novel exposure system is provided. The novel exposure system is illustrated in FIG. 8. The novel exposure system may essentially comprise an illuminating system provided over a mask 11 and a projecting system provided under the mask 11 and over a substrate 12 placed on a stage 13. The illuminating system includes a light source 6 for emitting an illumination light having a linear polarity. A polarizer 7 is provided under the light source 6 for subjecting the emitted light for illumination to a predetermined linear polarization, for example, the p-polarization. The polarizer 7 is controlled by an control section 8 electrically connected to the polarizer 7 to achieve the desired polarization such as the p-polarization. The p-polarized light for illumination then passes through a flyeyelens 9 and a condenser lens 10 and is then irradiated on the mask 11. The mask 11 has a predetermined pattern. The p-polarized light which has passed through the mask 11 has an optical image of the mask pattern and then passes through a projecting optical lens system 3 to be irradiated on the substrate 12 on which a resist film not shown was provided. The polarizer 7 and the controller 8 may comprise a half wave plate and a mechanical carrier, alternatively comprise an optoelectro polarization rotator and a voltage supplier. An amount of the rotation of the linear polarization is controlled by the polarizer 7 to allow the incident light to have the p-polarization direction against a sloped area of the surface of the wafer. The light source may be a KrF Excimer laser, ArF Excimer laser, i-ray or g-ray of a high pressure mercurial lamp or X-ray. The substrate may be semiconductor substrates such as silicon substrate or silicon oxide substrate, or a metal substrate such as Al substrate.

Figure 9:
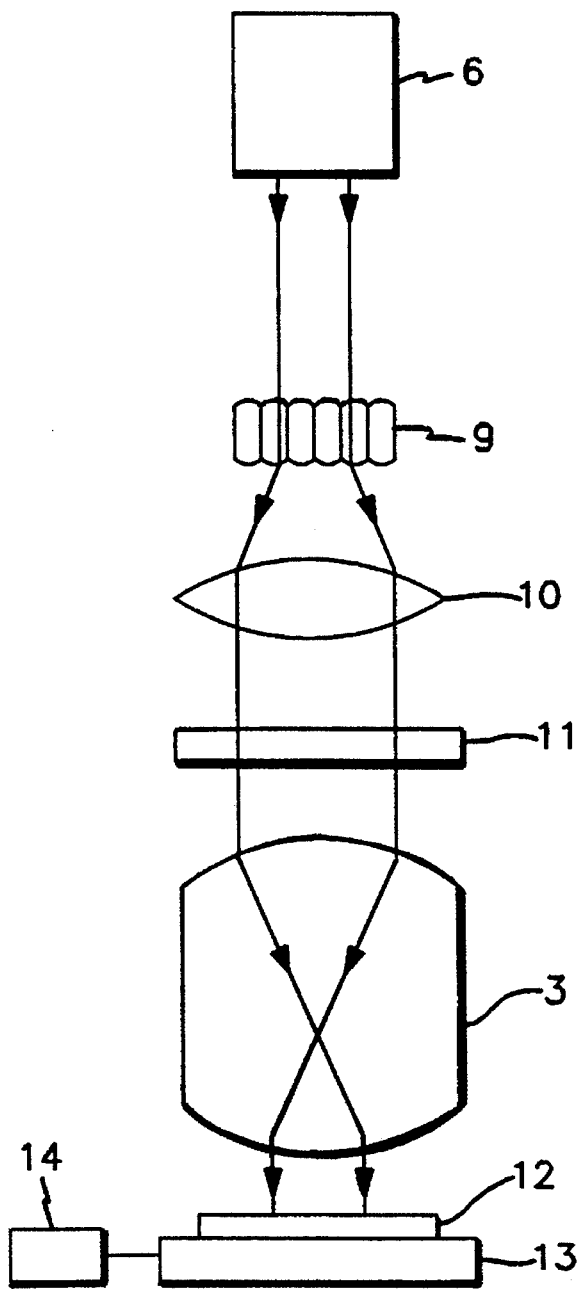

A second embodiment according to the present invention will be described in which a novel exposure system is provided. The novel exposure system is illustrated in FIG. 9. The novel exposure system may essentially comprise an illuminating system provided over a mask 11 and a projecting system provided under the mask 11 and over a substrate 12 placed on a stage 13. The illuminating system includes a light source 6 for emitting a linearly polarized illumination light. The linearly polarized light for illumination then passes through a flyeyelens 9 and a condenser lens 10 and is then irradiated on the mask 11. The mask 11 has a predetermined pattern. The linearly polarized light which has passed through the mask 11 has an optical image of the mask pattern and then passes through a projecting optical lens system 3 to be irradiated on the substrate 12 on which a resist film not shown was provided. The stage 13 may be rotated by control of a stage controller 14. A direction of the linear polarization of the illumination light is controlled by rotation of the stage on which the substrate 12 is placed to allow the incident light to have the p-polarization direction against a sloped area of the surface of the wafer. The light source may be a KrF Excimer laser, ArF Excimer laser, i-ray or g-ray of a high pressure mercurial lamp or X-ray. The substrate may be semiconductor substrates such as silicon substrate or silicon oxide substrate, or a metal substrate such as Al substrate.

Figure 10:
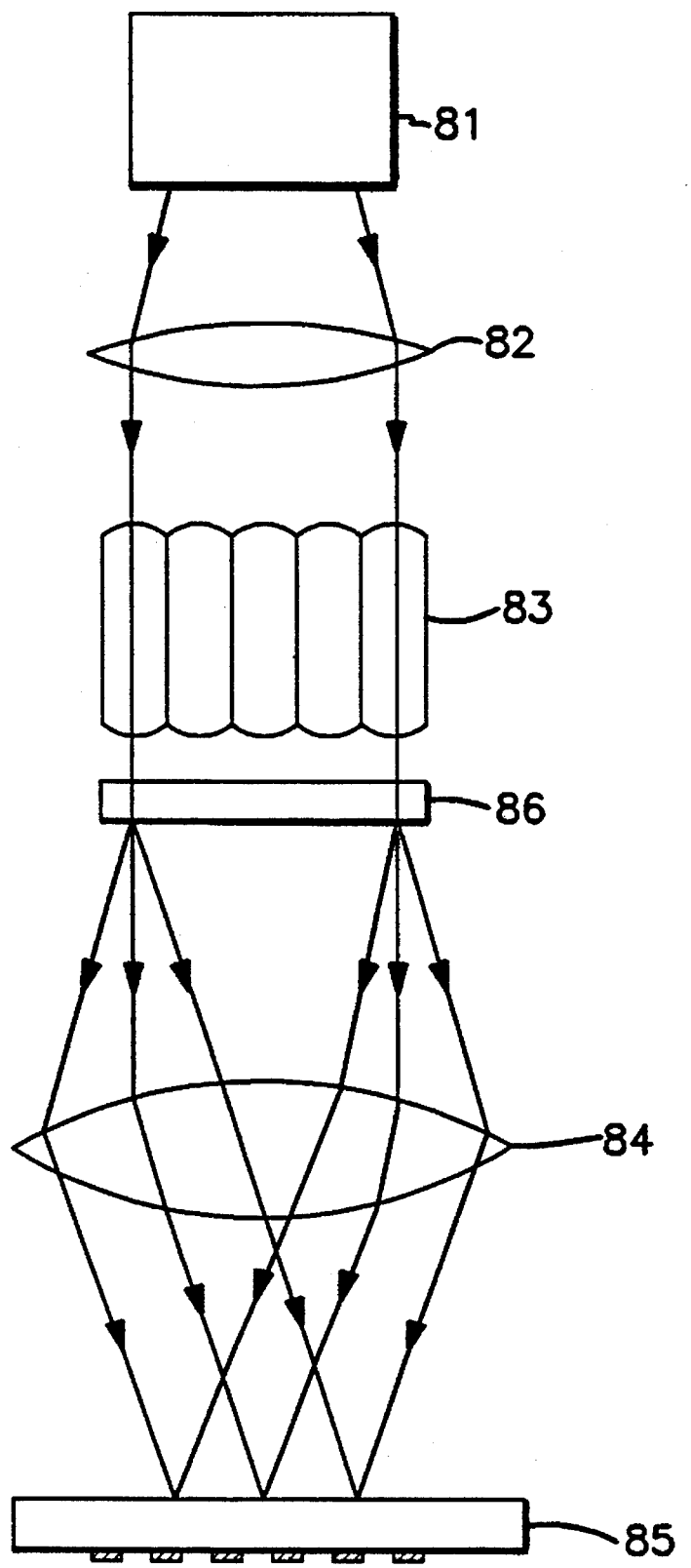
FIG. 10 is a diagram illustrative of an illuminating system in a third embodiment according to the present invention.

A third embodiment according to the present invention will be described in which a novel illuminating system used in an exposure system is provided. The novel illuminating system is illustrated in FIG. 10 and comprises a light source 81, a collimator lens 82, a flyeyelens 83, a space filter 86 and a condenser lens 84. The light source emits a linearly polarized illumination light to pass through the collimator lens 82 and then through the flyeye lens 83. The light for illumination is subsequently passes through the space filter 86 which provides a p-polarization. The space filter may comprise a metal plate with at least a plurality of apertures through which the light pass. The apertures are provided to be spaced apart from each other so that the light passed through the space filter 86 has an oblique direction of traveling thereof and then passes through the condenser lens 84, resulting in an oblique incidence of the illumination light having the p-polarity on a mask 85 having a predetermined pattern.

Figure 11:
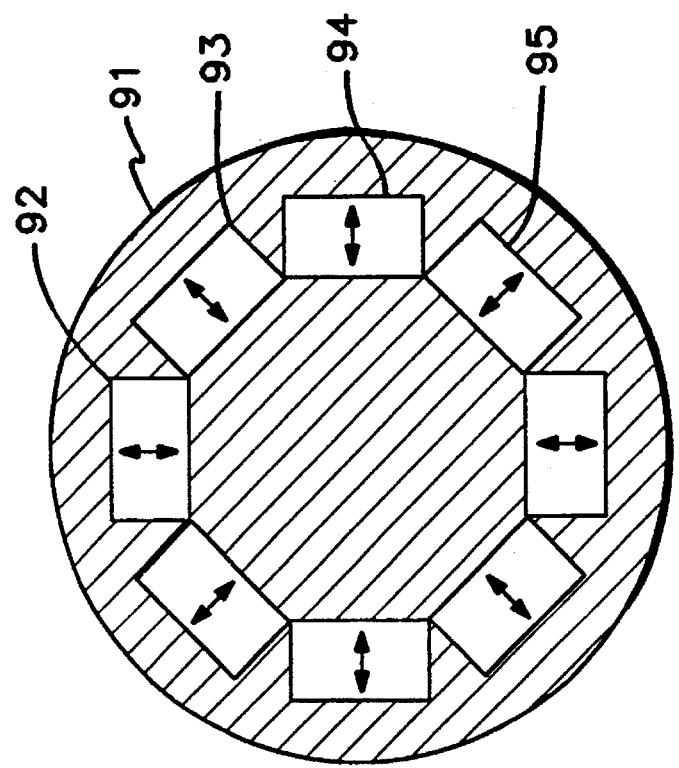
FIG. 11 is a plane views illustrative of a space filter for p-polarization.

The space filter for providing the p-polarity and allowing the oblique incidence of the light may be an annular space filter 91 as illustrated in FIG. 11. The annular space filter 91 is formed with a plurality of half wave plates 92, 93 and 94 having different polarization directions from each other. The plurality of the half wave filters 92, 93 and 94 are placed along a peripheral portion to be spaced apart to form a ring encompassing a center portion of the filter 91 so that the various polarization directions are directed along the diametrical direction for annular illumination which is able to improve a resolution.

Figure 12:
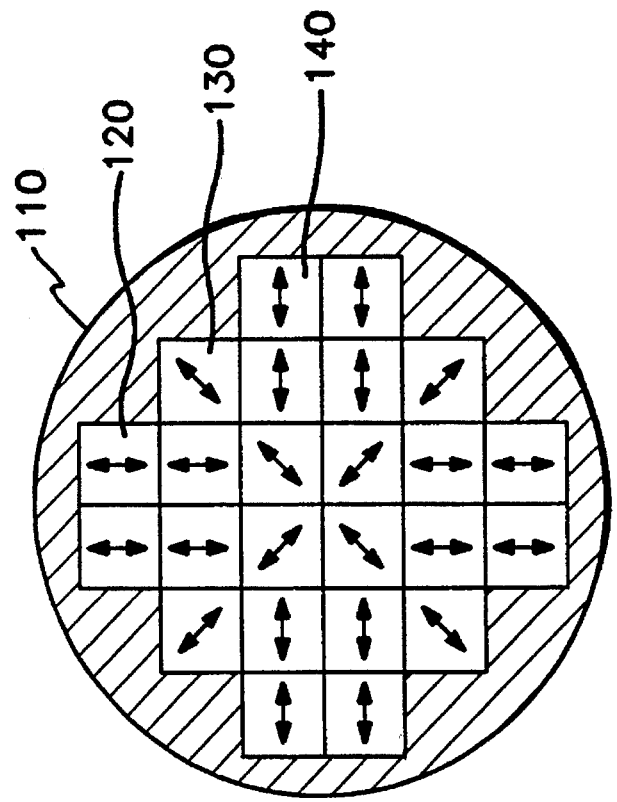
FIG. 12 is a plane views illustrative of another space filter for p-polarization.

Alternatively, the space filter for providing the p-polarity and allowing the oblique incidence of the light may be another space filter 110 as illustrated in FIG. 12. The space filter 110 is formed with a plurality of half wave plates 120, 130 and 140 having different polarization directions from each other. The plurality of the half wave filters 120, 130 and 140 are provided radially and continuously from a center portion of the filter 110 toward the peripheral portion thereof but not in contact with the peripheral edge so that the various polarization directions are almost directed along the diametrical direction.

The light source may be a KrF Excimer laser, ArF Excimer laser, i-ray or g-ray of a high pressure mercurial lamp or X-ray. The illuminating system is applicable not only the projection printing but also a contact printing or a proximity printing. The substrate may be semiconductor substrates such as silicon substrate or silicon oxide substrate, or a metal substrate such as Al substrate.

Figure 13:
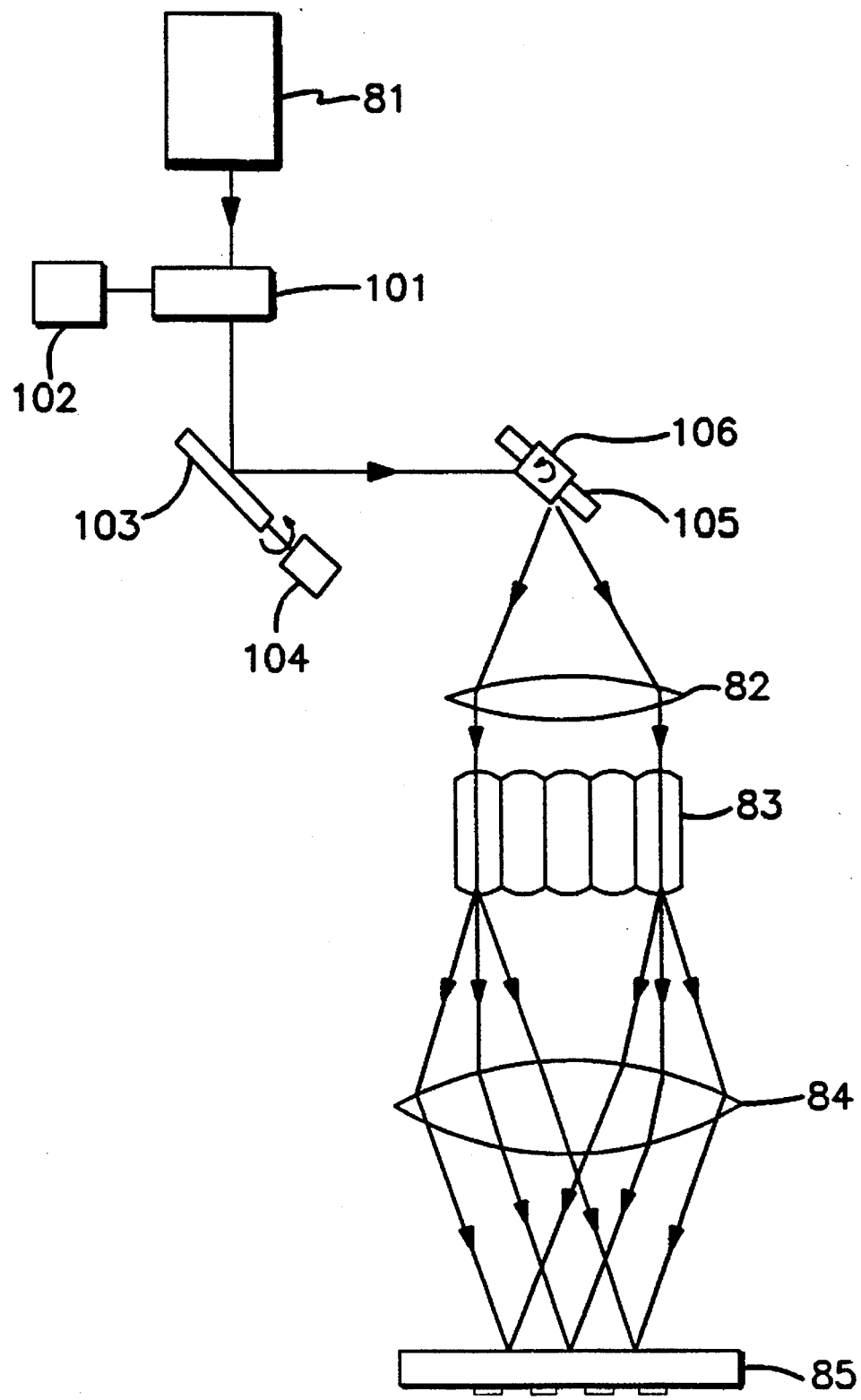
FIG. 13 is a diagram illustrative of an illuminating system in a fourth embodiment according to the present invention.

A fourth embodiment according to the present invention will be described in which a novel illuminating system used in an exposure system is provided. The novel illuminating system is illustrated in FIG. 13. The novel illuminating system includes a light source 81 for emitting an illumination light having a linear polarity. A polarizer 101 is provided under the light source 81 for subjecting the emitted light for illumination to a desired degree of rotation of the polarization direction so as to obtain the p-polarization. The polarizer 101 is controlled by an control section 102 electrically connected to the polarizer 101 to achieve the desired polarization such as the p-polarization. The illuminating system has a scanning system for allowing for the scanning of the p-polarized light on the entire or a part of a flyeyelens 81. The scanning system may comprise a pair of reflecting mirrors 103 and 105 which are rotatable by rotating devices 104 and 106 respectively. The rotating devices 104 and 106 are operated in association with the controller 102 so as to keep a linear polarization of the illuminating light and to allow an oblique incidence of the light. The p-polarized light for illumination then passes through the flyeyelens 9 and a condenser lens 10 to be irradiated on a mask 85 having a predetermined pattern at an oblique angle to the surface of the mask 85. The polarizer 101 and the controller 102 may comprise a half wave plate and a mechanical carrier, alternatively comprise an optoelectro polarization rotator and a voltage supplier. An amount of the rotation of the linear polarization is controlled by the polarizer 101 to allow the incident light to have the p-polarization direction against a sloped area of the surface of the wafer. The paired reflecting mirrors 103 and 105 are movable to vary the directions of mirror faces thereof to vary the traveling route of the light for scanning of the light for illumination and oblique incidence thereof. The light source may be a KrF Excimer laser, ArF Excimer laser, i-ray or g-ray of a high pressure mercurial lamp or X-ray. The illuminating system is applicable not only the projection printing but also a contact printing or a proximity printing. The substrate may be semiconductor substrates such as silicon substrate or silicon oxide substrate, or a metal substrate such as Al substrate.

Whereas modifications of the present invention will no doubt be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications of the present invention which fall within the sprit and scope of the invention.

What is claimed is:

1. An illuminating system involved in an exposure system for irradiating a linearly polarized illumination light on a mask with a predetermined pattern, wherein provision is made of means for controlling a polarization direction of said light at a p-polarization direction, said controlling means being provided between a light source and optical lenses and having an oblique incident feature which allows said light to be irradiated on said mask at an oblique angle to a surface of said mask, said controlling means comprising a space filter having at least a plurality of half wave plates being spaced apart from each other, each of said half wave plates having a polarization direction along with a radial direction of said filter.

2. The illuminating system as claimed in claim 1, wherein said controlling means comprises at least a polarizer being provided between a light source and optical lenses.

3. The illumination system as claimed in claim 1, wherein said space filter has a disc-like shape and said half wave plates are provided in the form of circulation along with a peripheral portion of said space filter for annular illumination where polarization directions of said individual half wave plates are directed toward radial directions.

4. The illumination system as claimed in claim 3, wherein said half wave plates are provided in contact with each other and continuously provided from a center of said space filter to said peripheral portion where polarization directions of said individual half wave plates are directed toward radial directions.

5. The illumination system as claimed in claim 1, wherein said controlling means comprises:

a polarizer; and a scanning system being provided between said polarizer and optical lenses for conducting a scanning of said illumination light over said mask, said scanning system having an oblique incident feature which allows said light to be irradiated on said mask at an oblique angle to a surface of said mask.

6. The illuminating system as claimed in claim 5, wherein said scanning system comprises a pair of reflecting mirrors provided with controllers for controlling mirror face directions in association with an operation of said polarizer to implement said scanning of said light so that said light is irradiated on said mask at an oblique angle during said scanning.

7. An exposure system including:

at least an illuminating system for irradiating a linearly polarized illumination light on a mask with a predetermined pattern; and a mounting system on which a wafer is placed, said wafer being provided thereon with a resist film, wherein further provision is made of means for controlling a polarization direction of said light at a p-polarization direction at least when said light is irradiated on a sloped or vertical portion of said wafer, said control means being provided between a light source and optical lenses and having an oblique incident feature which allows said light to be irradiated on said mask at an oblique angle to a surface of said mask, said control means comprising a space filter having at least a plurality of half wave plates being spaced apart from each other, each of said half wave plates having a polarization direction along with a radial direction of said filter.

8. The exposure system as claimed in claim 7, wherein said mounting system comprises:

a rotatable mounting plate on which said wafer is placed; and a rotation controller for controlling a rotation of said mounting plate so that the polarization direction of said light is kept at a p-polarization direction at least when said light is irradiated on a sloped or vertical portion of said wafer.

9. The exposure system as claimed in claim 7, wherein said control means comprises a polarizer being provided between a light source and optical lenses.

10. The exposure system as claimed in claim 7, wherein said space filter has a disc-like shape and said half wave plates are provided in the form of a circulation along with a peripheral portion of said space filter for annular illumination where polarization directions of said individual half wave plates are directed toward radial directions.

11. The exposure system as claimed in claim 10, wherein said half wave plates are provided in contact with each other and continuously provided from a center portion of said space filter toward said peripheral portion where polarization directions of said individual half wave plates are directed toward radial directions.

12. The exposure system as claimed in claim 7, wherein said control means comprises:

a polarizer; and a scanning system being provided between said polarizer and optical lenses for conducting a scanning of said illumination light onto said mask, said scanning system having an oblique incident feature which allows said light to be irradiated on said mask at an oblique angle to a surface of said mask.

13. The exposure system as claimed in claim 12, wherein said scanning system comprises a pair of reflecting mirrors provided with controllers for controlling mirror face directions in association with an operation of said polarizer to implement said scanning of said light so that said light is irradiated on said mask at an oblique angle during said scanning.

* * * * *